United States Patent
Motamedi

(10) Patent No.: US 7,293,250 B2
(45) Date of Patent: Nov. 6, 2007

(54) METHOD OF MODELING PHYSICAL LAYOUT OF AN ELECTRONIC COMPONENT IN CHANNEL SIMULATION

(75) Inventor: Amir Motamedi, Munich (DE)

(73) Assignee: Infineon Technologies, AG, Neubiberg (DE)

( * ) Notice: Subject to any disclaimer, the term of this patent is extended or adjusted under 35 U.S.C. 154(b) by 122 days.

(21) Appl. No.: 11/272,023

(22) Filed: Nov. 14, 2005

(65) Prior Publication Data

US 2007/0109903 A1   May 17, 2007

(51) Int. Cl.
    G06F 17/50    (2006.01)
    G06G 7/48     (2006.01)
(52) U.S. Cl. .................. 716/18; 716/2; 716/9; 716/10; 703/4; 703/16
(58) Field of Classification Search ............ 716/18, 716/2, 9, 10; 703/4, 16
    See application file for complete search history.

(56) References Cited

U.S. PATENT DOCUMENTS

| | | | | |
|---|---|---|---|---|
| 5,436,589 A | * | 7/1995 | La Rosa et al. ............ | 329/302 |
| 6,094,450 A | * | 7/2000 | Shockey ..................... | 375/141 |
| 2003/0031282 A1 | * | 2/2003 | McCormack et al. ....... | 375/355 |
| 2004/0001561 A1 | * | 1/2004 | Dent et al. .................. | 375/308 |
| 2004/0088624 A1 | * | 5/2004 | Gauthier et al. ............ | 714/737 |
| 2004/0101046 A1 | * | 5/2004 | Yang et al. ............ | 375/240.08 |
| 2004/0123191 A1 | * | 6/2004 | Salant et al. ................ | 714/704 |
| 2004/0208568 A1 | * | 10/2004 | Sweeney et al. .............. | 398/79 |
| 2004/0268190 A1 | * | 12/2004 | Kossel et al. ............... | 714/704 |
| 2005/0132258 A1 | * | 6/2005 | Chen et al. ................. | 714/704 |
| 2005/0186933 A1 | * | 8/2005 | Trans ......................... | 455/296 |

* cited by examiner

*Primary Examiner*—Phallaka Kik
(74) *Attorney, Agent, or Firm*—Edell, Shapiro & Finnan, LLC

(57) ABSTRACT

A method of developing the physical layout of an electronic component in a data bus connected logic analog system includes: providing a data bus connected logic analog system modeled as a software-implemented channel simulation model including: a bit pattern generator for generating a bit pattern; the electronic component, whose physical layout is to be determined by being modeled as a black box characterized by model parameters; and a bit pattern analyzer for analyzing a bit error rate of the bit pattern; sending an input bit pattern through the black box to produce an output bit pattern and comparing the output bit pattern with the input bit pattern to determine a bit error rate; and varying the model parameters and repeating the process until the determined bit error rate is below a pre-determined value to determine at least one critical model parameter boundary.

4 Claims, 5 Drawing Sheets

PKG: Package-Development
SYS: System Design

METHOD OF MODELING PHYSICAL LAYOUT OF AN ELECTRONIC COMPONENT IN CHANNEL SIMULATION

TECHNICAL FIELD

The invention relates to the field of software-implemented design of logic analog systems and more particularly to a method of modeling the physical layout of an electronic component in channel simulation of data bus connected logic analog systems.

BACKGROUND

Modern logic analog system design typically is based on software-implemented simulation methods conventionally referred to as so-called "bus simulation" or "channel simulation" where logic analog systems are mapped on equivalent electronic circuits basically known to those of skill in the art. See for instance High-Speed Digital System Design: A Handbook of Interconnect Theory and Design Practices, John Wiley and Sons, 2000.

In order to illustrate channel simulation, reference is now made to FIG. 1 depicting a software-implemented equivalent circuit of a logic analog memory chip system, where each component is modeled to have specified electrical characteristics. For example, a logic analog memory chip system modeled as a channel as shown in FIG. 1 may comprise a memory controller 1, a motherboard 2, a plug 3, a printed circuit board 4, a memory chip package 5, and a memory chip 6 that are serially connected in that order by a data bus 8, as in typical built-in situations, where a packaged memory is connected to the printed circuit board that is plugged into the motherboard and controlled by the memory controller. More specifically, software-implemented channel simulation of the memory chip system maps electrical characteristics of each system component having a specifically designed physical (real) layout.

For testing electrical behavior of the model system, a bit pattern is generated, for instance using memory controller 1 or any other kind of bit pattern generator, which bit pattern is sent through the data bus (or channel) and is analyzed at the end of the channel using bit pattern analyzer 7 conductively connected to the memory chip 6 for determining a bit error rate as a result of comparing the generated bit pattern at the beginning of the channel and the analyzed bit pattern at the end of the channel.

As is known to those of skill in the art, electrical parasitics may occur at each modeled system component as a result of inductive, capacitive and/or resistive loads thereof that may effect a change of height and/or shape of transmitted bit pattern signals (i.e., distortion of transmitted bit pattern signals). Hence, degradation of the bit pattern signals may prevent a clear discrimination of logic values with accidental changes of logic values of the initial bit pattern sent through the channel.

Given a memory chip system as exemplified in FIG. 1, typically a problem occurs that the physical layout of the memory chip packaging has to be adapted separately to any specified physical memory chip system layout.

For further illustration thereof, reference is now made to FIG. 2 depicting a flow diagram of conventional development of the physical memory chip packaging layout in conventional channel simulation of memory chip systems. Typically, starting with forwarding of rough design input as to the desired chip package layout (giving information such as pin arrangement, pin density and the like) from memory system designers, package designers chose a specific package layout on basis of experience in line with the system designers' input. Package layout may eventually be adapted to the system designers' input. Next, the chosen package layout is further adapted to reduce electrical parasitics and is then supplied to the system designers for integration into the model memory system. Memory system designers then must check whether the electrical behavior of model system having integrated the suggested package layout satisfies their needs with respect to an achieved bit error rate. If so, the physical memory system including memory chip package is released and, if not, the process of developing packaging layout must be repeated to find an appropriately designed chip package. Typically, in developing the packaging layout, 15 to 20 iterations are necessary to find a packaging layout appropriately adapted to be integrated in a specific system layout. Consequently, development of the packaging layout can be very time consuming and cost consuming.

Furthermore, in recent years, density of system components, operational frequency, and bit rate of logic systems have increased tremendously so that the conventional approach to developing chip packages as described above is considered to be too slow and/or insufficient to cope with system developers needs.

SUMMARY

The invention provides an improved method of developing a physical electronic component in a logic analog system. Specifically, a method for developing a physical layout of an electronic component in a data bus connected logic analog system includes providing a data bus connected logic analog system modeled as software-implemented channel simulation comprising as modeled electronic components: a generator for generating a bit pattern, a (passive) electronic component (preferably a chip package) the physical layout of which is to be developed by being modeled as a black box having electrical characteristics, and a bit pattern analyzer for analyzing a bit error rate of the bit pattern, which electric components are serially connected in that order by the data bus. The logic analog system preferably comprises a chip controller, a motherboard, a plug, a printed circuit board, a chip package, and a chip, as in a typical built-in situation.

The black box is modeled as a "lumped model" and/or as an "S-parameter model" both of which are known to those of skill in the art. In the lumped model, to reflect the electrical characteristics of the passive electronic component whose physical layout is to be developed, this electronic component is modeled as a Resistance, Inductivity, dielectric current, and capacitor (RLGC) model or matrix in the time domain (i.e., a matrix of resistors, capacitors, inductivities and dielectric currents which connect each port of the component to the other ports, so that the relation of the voltage and currents on each pin of the component are always defined in dependency of the others). The lumped model is known as such to those of skill in the art, see for instance High-Speed Signal Propagation: Advanced Black Magic, Howard Johnson and Martin Graham, Prentice Hall PTR, 2003.

In the S(cattering)-parameter model, which preferably is done in the frequency domain, S-parameters which are the square-root of the power waves, are applied to the ports of the components and measured at all other ports. In this manner, the dependency of each port from others is defined and certain. The S-parameter model is known as such to those of skill in the art, see for instance: Lehrbuch der Hochfrequenztechniki, Zinke, Brunswig, Springer, 1965. Initially, the model parameters (RLGC in the lumped model, S-parameter in the S-parameter model) are set on initial parameter values.

The method further includes generating a bit pattern and sending the bit pattern through the black box and analyzing the output bit pattern to determine a bit error rate by comparing the output bit pattern with the original bit pattern generated by the bit pattern generator.

The method further includes varying the model parameters and repeating the bit pattern test at least once until the determined bit error rate is below a pre-determined (selectable) first bit error rate boundary value and/or above a pre-determined (selectable) second bit error rate boundary value. Upon doing so, critical parameter values (or critical parameter ranges or critical parameter boundaries) can be determined, resulting in bit error rates lying below the first bit error rate boundary value and/or above the bit error rate boundary value.

Finally, the method includes selecting a software-implemented physical (real) layout of the electronic component whose physical layout to be developed on the basis of the determined critical parameter values and integrating thereof in the software-implemented logic analog system.

In above method, it may be appropriate to repeat the preceding operations at least once to further adapt the physical layout (and electric behavior thereof) of the electronic component whose physical layout is to be determined.

The above and still further objects, features and advantages of the present invention will become apparent upon consideration of the following definitions, descriptions and descriptive figures of specific embodiments thereof wherein like reference numerals in the various figures are utilized to designate like components. While these descriptions go into specific details of the invention, it should be understood that variations may and do exist and would be apparent to those skilled in the art based on the descriptions herein.

BRIEF DESCRIPTION OF THE DRAWINGS

The accompanying drawings, which are incorporated in and constitute a part of the specification, illustrate presently preferred embodiments of the method of the invention and, together with the general description given above and the detailed description given below, serve to explain the principles of the invention.

DETAILED DESCRIPTION

Figure 1:
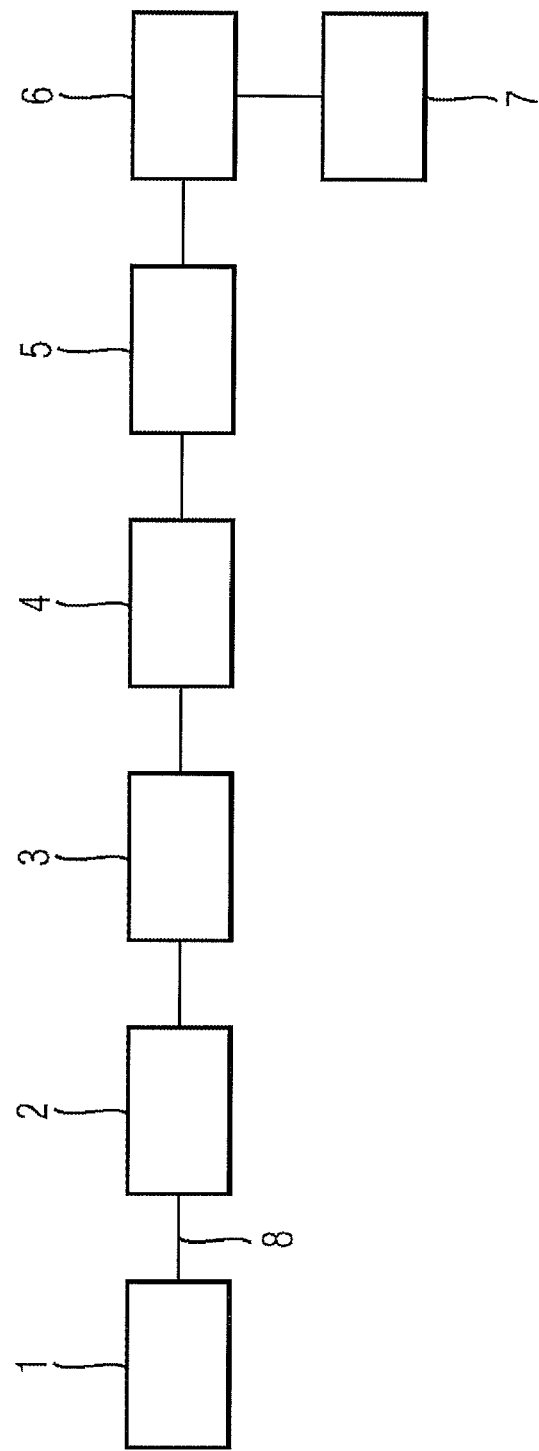
FIG. 1 illustrates schematically a logic analog system arrangement as modeled in equivalent circuitry.
Figure 2:
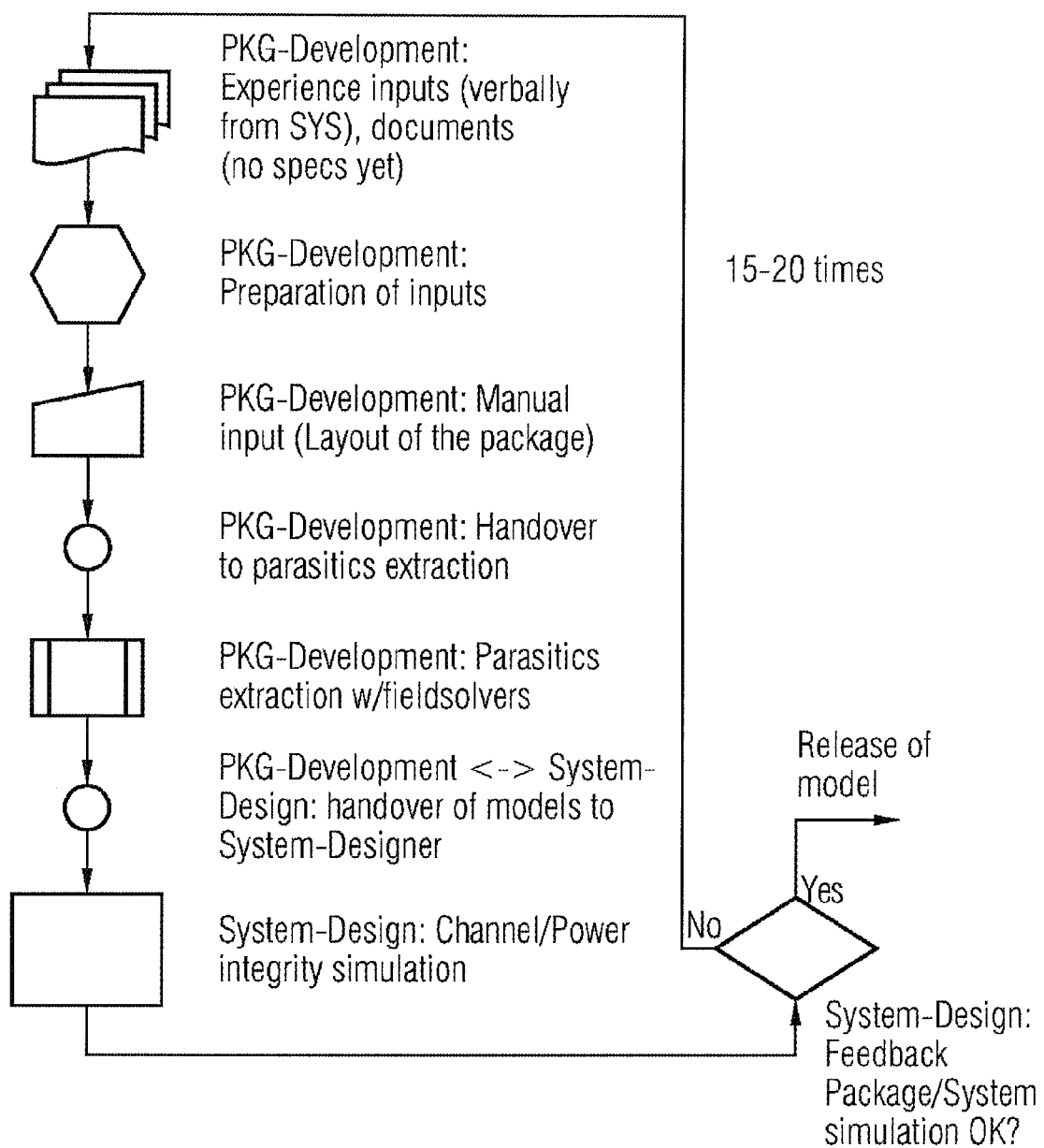
FIG. 2 depicts a flow diagram of conventionally developing physical layout of the chip package to be integrated in the modeled logic analog system of FIG. 1.
Figure 3:
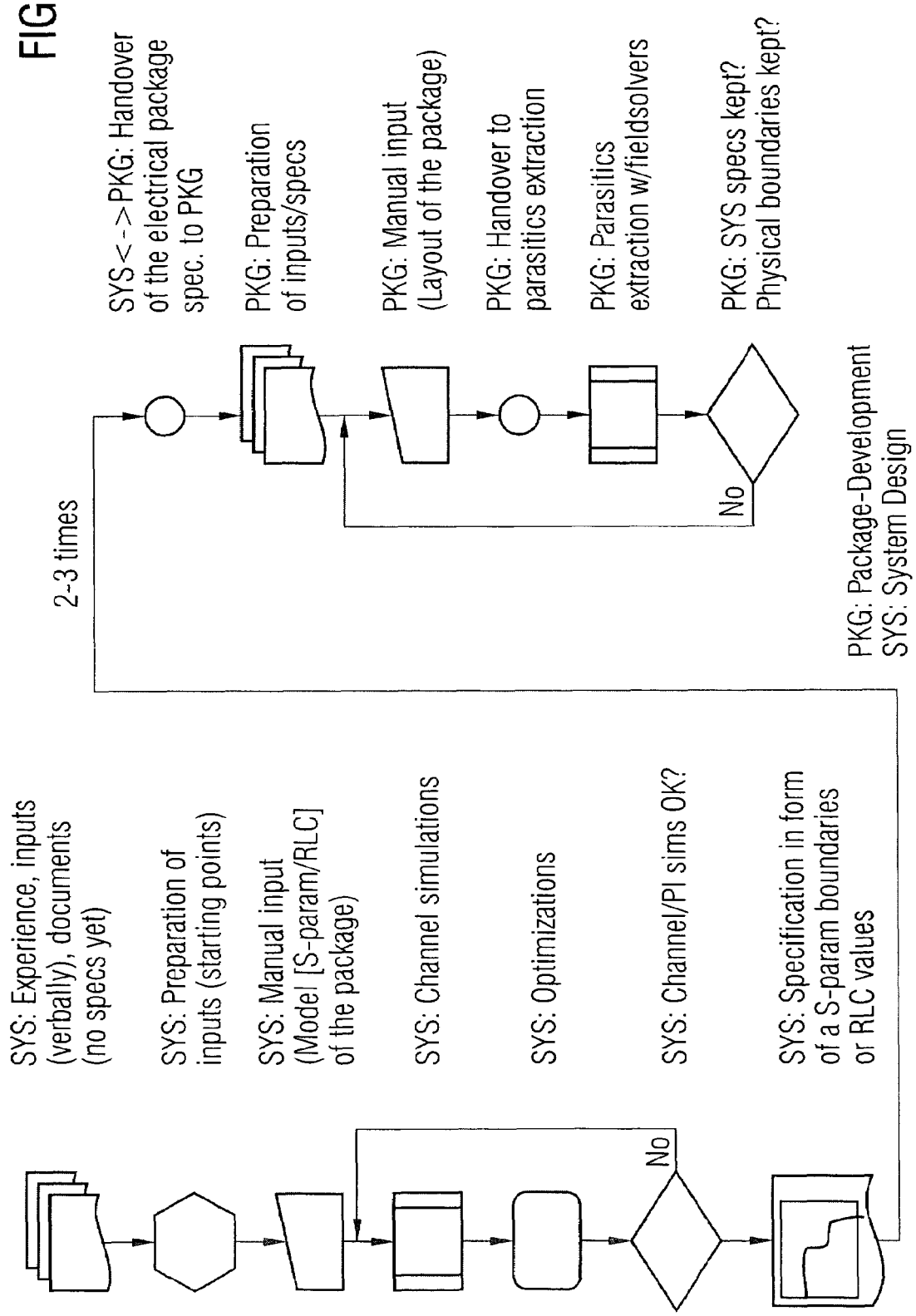
FIG. 3 depicts a flow diagram of developing a physical layout of the chip package to be integrated in the modeled logic analog system according to embodiments of the invention.
Figure 4:
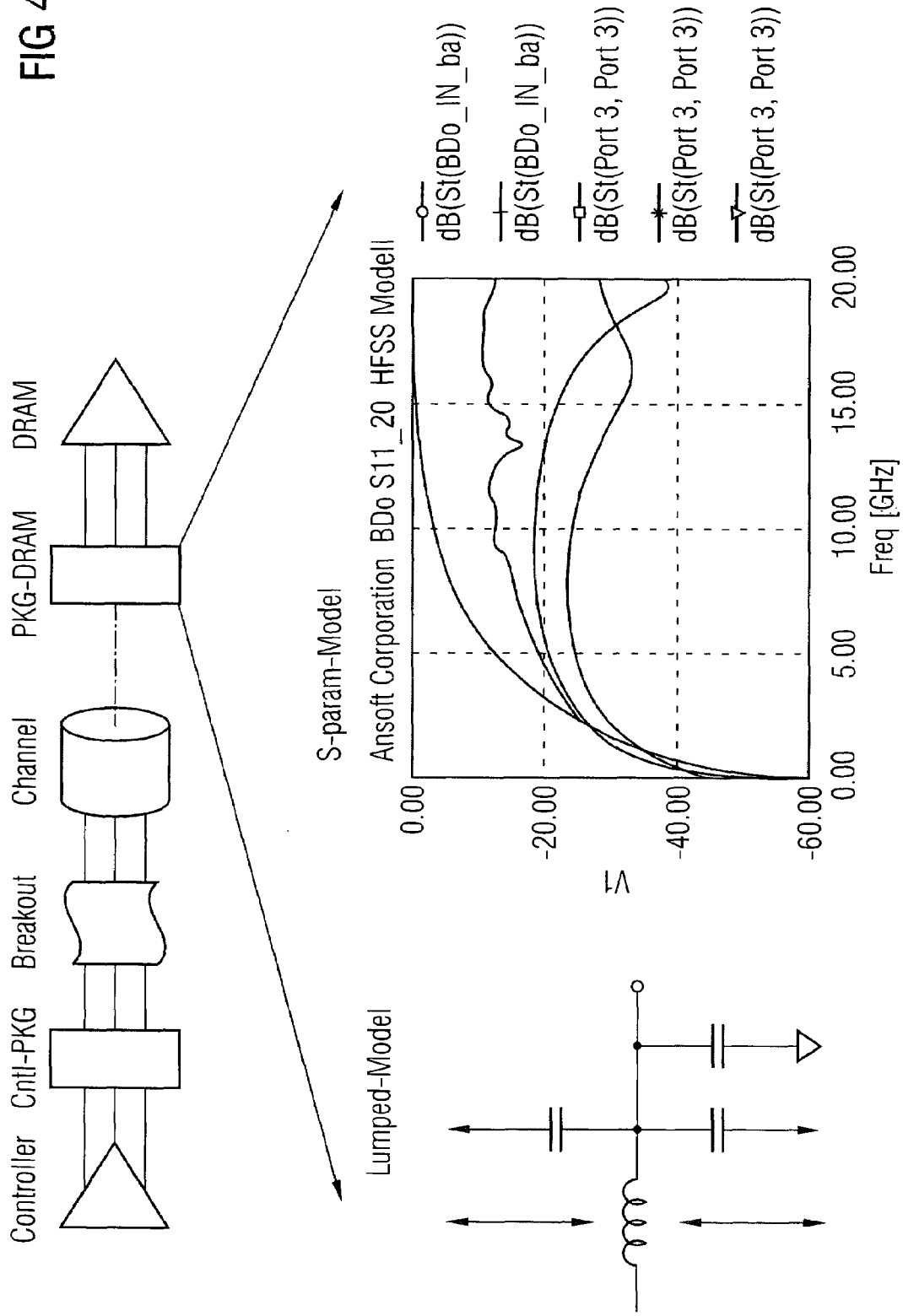
FIGS. 4 to 5 illustrates use of the lumped model and S-parameter model in the channel simulation of FIG. 3.
Figure 5:
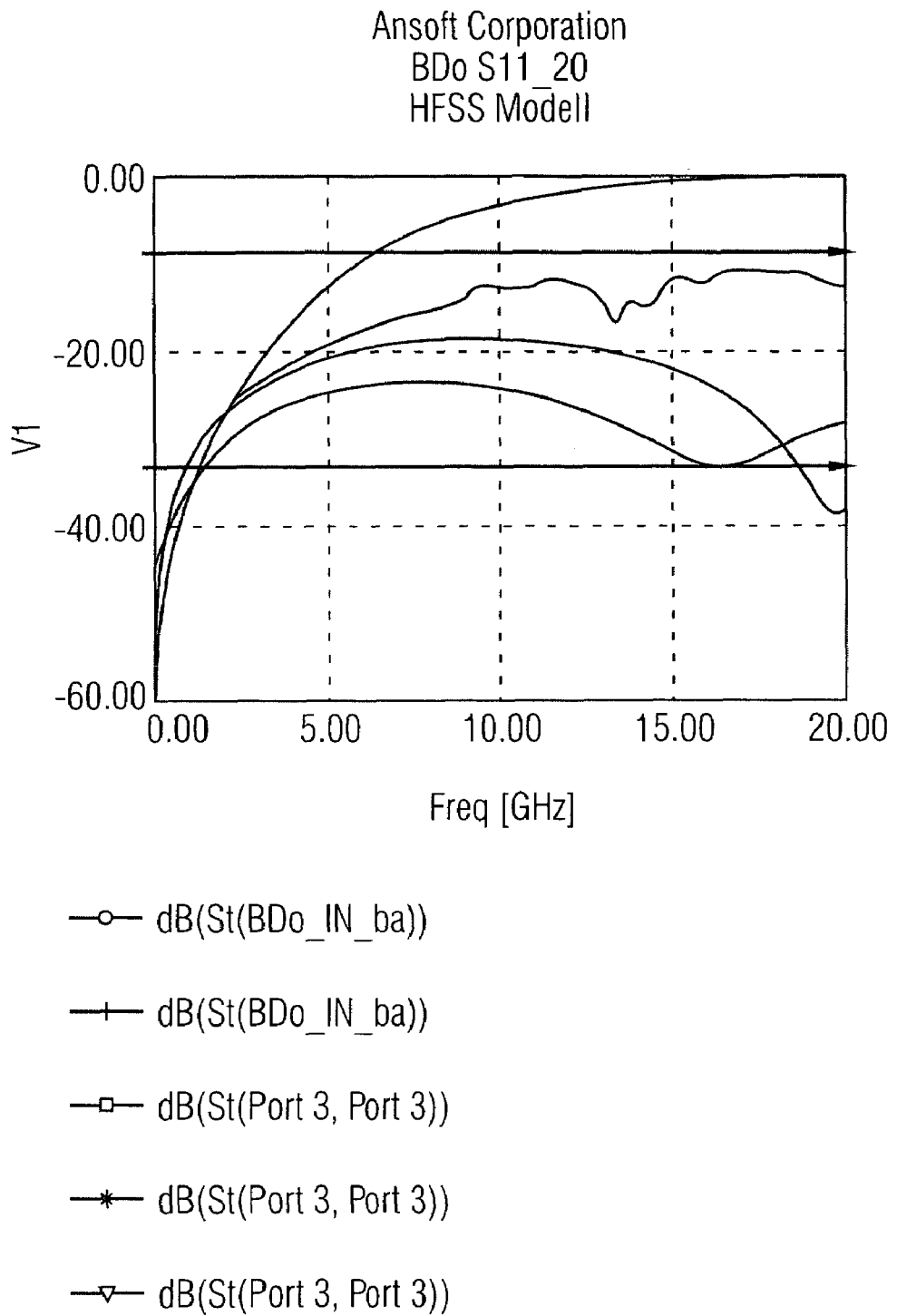

Exemplary embodiments of the techniques of the invention will be described in detail below with reference to the accompanying drawings. Referring to FIGS. 3 through 5, a method of developing a physical layout of the chip package in channel simulation of a memory system (DRAM package) is explained. With particular reference to FIG. 3, a flow diagram of developing a physical layout of a DRAM chip package to be integrated into modeled DRAM system according to embodiments of the invention is detailed.

Accordingly, starting with providing a software-implemented data bus connected DRAM system mapped to an equivalent circuitry in channel simulation which includes DRAM controller, motherboard, plug, printed circuit board, chip package and DRAM chip, serially connected via the data bus, the chip package is modeled as a black box having electrical characteristics using the lumped model as illustrated and/or the S-parameter model.

In the first step, the system designer prepares the requirements of the package and put these requirements in the form of an initial S-parameter model or lumped model into a channel simulation (assumed other aspects of the channel are known).

After the first simulation, the system designer can judge whether the initial values fulfill the requirements (with help of the bit error rate) and if necessary change the electrical model as long as it fits the channel requirements. In this stage, the electrical model is ready to be sent to the Package Design, and the package designer attempts to satisfy these electrical parameters by a physical design (in this case the real layout of the package). After the first iteration, the package designer extracts the parasitics of the package (in lumped or S-parameter model) and compares it to the given data of the system designer. In the event that these are comparable (within certain tolerances), the package designer was successful in designing a package to satisfy both the channel model in simulation and in the actual physical embodiment.

Starting with initial conditions for the parameter values of the modeled black box, generating a plurality of bit patterns using the DRAM controller and analyzing thereof using a bit pattern analyzer, bit error rates of the modeled DRAM systems are determined. Then, varying the parameter values of the black box, the previous step is repeated at least once for specifying critical parameter values and/or critical parameter value boundaries and/or critical parameter value ranges of the black box to produce a bit pattern error rate lying below a pre-determined upper bit pattern error rate limit and, eventually, above a pre-determined lower bit pattern error rate limit. Accordingly, adaptation of the layout of the DRAM system components, particularly DRAM chip package, is performed. More specifically, the required target component's electrical characteristics in the channel are modified as long as the worst case of the bit error rate of the system is reached. In this case it is assured that this electrical characteristic reflects the worst case of the unknown component (in this case a package for a DRAM) in the logic analog channel system.

Upon doing so, specification of electrical characteristics of the black box as given by the critical parameter values and/or critical parameter value boundaries and/or critical parameter value ranges of the black box are determined.

As is exemplified in FIG. 4, wherein part of the DRAM system's equivalent circuitry is shown, such specification can be achieved in modeling the DRAM package as a lumped-model, that is to say, as an equivalent circuitry of the package resulting in critical R-, L-, G-, C-values, or as S-parameter model resulting in critical S-parameter value and boundaries, respectively.

Usually this modeling is done by some field solvers which calculate the parasitics by modeling the geometry and the boundary conditions. For this example, an initial model (either S-parameter or lumped model) is needed, and the system designer can modify the values (change the curve for the S-parameter, or change the values for the lumped model) to fulfill the system requirements.

In the lumped-model capacitance, inductance, dielectric current and/or resistance values are varied until limits of detecting the signal are attained. Otherwise, in the S-parameter model, insertion-loss and/or return-loss curves are varied until transfer function limits of the frequency simulation are reached.

Hence, in the lumped-model resistance, inductance or capacitance values are obtained, or alternatively, in the S-parameter model, maximally/minimally admissible curves are obtained.

Accordingly, as an example, specification boundaries of electrical characteristics as obtained from the lumped model may, for example, be given as $C1<1.5$ pF, $C2<0.5$ pF and $2nH<L1<2.8$ nH.

Alternatively, in the S-parameter model, specification boundaries can be determined based on the diagram achieved, for example, as illustrated by bold-printed lines as shown in FIG. 5. Specified electrical behavior of the DRAM package to be incorporated into the DRAM system is fully characterized by above boundary values. These curves show the (simulated/extracted) reflected power wave and the transported power wave, and in this way the package electrical characteristics are fully defined.

Boundary values of the DRAM package as obtained above are then forwarded to package designers and are used as electrical/visual specifications to selecting a software-implemented physical layout of the chip package. The selected package layout then is optimized as necessary to reduce electrical parasitics and/or until the specifications as achieved above are met.

Afterward, a software-implementation of the selected physical layout of the DRAM package achieved is integrated into the logic analog DRAM system and is tested by generating at least one bit pattern and analyzing the bit pattern using the bit pattern analyzer to determine a bit error rate of the logic system including the selected physical layout of the chip package and comparing the determined bit error rate to the predetermined boundary value thereof.

If the requirements of the system designers as to the electrical behavior of the laid-out DRAM package are not met, the above steps of determining DRAM package specification as expressed by critical parameter values/boundaries and selecting of the (software-implemented) physical layout of the DRAM package are repeated as needed. Typically a step repetition number of two to three yields good results.

Obviously many modifications and variations of the present invention are possible in light of the above description. It is therefore to be understood, that within the scope of appended claims, the invention may be practiced otherwise than as specifically devised.

REFERENCE LIST

1 DRAM controller
2 Motherboard
3 Plug
4 Printed circuit board
5 DRAM package
6 DRAM chip
7 Bit pattern analyzer

What is claimed is:

1. A method of developing a physical layout of an electronic component in a data bus connected logic analog system, the method comprising:
(i) providing a data bus connected logic analog system modeled as a software-implemented channel simulation model comprising as electronic components: a bit pattern generator for generating a bit pattern; the electronic component, whose physical layout is to be determined by being modeled as a black box having electrical characteristics, the electronic component being modeled as a lumped model and/or an S-parameter model that is characterized by model parameters, the model parameters being set to initial values; and a bit pattern analyzer for analyzing a bit error rate of the bit pattern, said electronic components being serially connected by a data bus;
(ii) sending an input bit pattern generated by the bit pattern generator through the black box to produce an output bit pattern, and analyzing the output bit pattern with the bit pattern analyzer to determine a bit error rate by comparing the output bit pattern with the input bit pattern;
(iii) varying the model parameters and repeating step (ii) at least once until the determined bit error rate is below a pre-determined first bit error rate boundary value to determine at least one critical model parameter boundary; and
(iv) selecting a software-implemented physical layout of the black box based on the critical model parameter boundary and integrating the software-implemented physical layout of the black box in the logic analog system.

2. The method of claim 1, wherein the black box comprises a chip package.

3. The method of claim 1, further comprising repeating steps (i) through (iii) at least once.

4. The method of claim 3, wherein the black box comprises a chip package.

* * * * *